United States Patent
Holt et al.

(10) Patent No.: US 11,749,747 B2
(45) Date of Patent: Sep. 5, 2023

(54) BIPOLAR TRANSISTOR STRUCTURE WITH COLLECTOR ON POLYCRYSTALLINE ISOLATION LAYER AND METHODS TO FORM SAME

(71) Applicant: GlobalFoundries U.S. Inc., Malta, NY (US)

(72) Inventors: Judson R. Holt, Ballston Lake, NY (US); Vibhor Jain, Clifton Park, NY (US); Jeffrey B. Johnson, Essex Junction, VT (US); John J. Pekarik, Underhill, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 59 days.

(21) Appl. No.: 17/574,661

(22) Filed: Jan. 13, 2022

(65) Prior Publication Data

US 2023/0223463 A1 Jul. 13, 2023

(51) Int. Cl.
*H01L 29/737* (2006.01)
*H01L 29/66* (2006.01)
*H01L 21/763* (2006.01)
*H01L 29/06* (2006.01)

(52) U.S. Cl.
CPC ........ *H01L 29/7371* (2013.01); *H01L 21/763* (2013.01); *H01L 29/0642* (2013.01); *H01L 29/66242* (2013.01)

(58) Field of Classification Search
CPC ............... H01L 29/7371; H01L 21/763; H01L 29/0642; H01L 29/66242
See application file for complete search history.

(56) References Cited

U.S. PATENT DOCUMENTS

| | | |
|---|---|---|
| 4,567,645 A | 2/1986 | Cavanaugh et al. |
| 6,569,730 B2 | 5/2003 | Tsai et al. |
| 7,485,537 B2 | 2/2009 | Ho et al. |
| 8,003,473 B2 | 8/2011 | Pagette et al. |
| 9,514,998 B1 | 12/2016 | Basker et al. |
| 2011/0147892 A1 | 6/2011 | Chiu et al. |
| 2019/0109055 A1* | 4/2019 | Preisler ............... H01L 29/0692 |
| 2021/0091180 A1 | 3/2021 | Pekarik et al. |

OTHER PUBLICATIONS

European Search Report for corresponding EP Application No. 22203386.2 dated May 9, 2023, 5 pages.

* cited by examiner

*Primary Examiner* — Syed I Gheyas
(74) *Attorney, Agent, or Firm* — Francois Pagette; Hoffman Warnick LLC

(57) ABSTRACT

Embodiments of the disclosure provide a bipolar transistor structure with a collector on a polycrystalline isolation layer. A polycrystalline isolation layer may be on a substrate, and a collector layer may be on the polycrystalline isolation layer. The collector layer has a first doping type and includes a polycrystalline semiconductor. A base layer is on the collector layer and has a second doping type opposite the first doping type. An emitter layer is on the base layer and has the first doping type. A material composition of the doped collector region is different from a material composition of the base layer.

20 Claims, 9 Drawing Sheets

BIPOLAR TRANSISTOR STRUCTURE WITH COLLECTOR ON POLYCRYSTALLINE ISOLATION LAYER AND METHODS TO FORM SAME

STATEMENT REGARDING GOVERNMENT RIGHTS

This invention was made with government support under contract number HR011-20-3-0002 awarded by the Defense Advanced Research Projects Agency (DARPA). The government has certain rights in the invention.

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs, and/or operational parameters that do not meet certain requirements. For example, bipolar transistors structured to include non-conventional semiconductor materials may require etching away an initial region and regrowing the material in a desired location. In cases where multiple instances of etching and regrowing are needed, these process modifications may significantly increase manufacturing costs.

SUMMARY

The illustrative aspects of the present disclosure are designed to solve the problems herein described and/or other problems not discussed.

Embodiments of the disclosure provide a bipolar transistor structure including: a polycrystalline isolation layer on a substrate; a collector layer over the polycrystalline isolation layer, the collector layer having a first doping type, wherein a lower surface of the collector layer physically interfaces with an upper surface of the polycrystalline isolation layer; a base layer on the collector layer, the base layer having a second doping type opposite the first doping type; and an emitter layer on the base layer, the emitter layer having the first doping type, wherein the material composition of the collector layer is different from a material composition of the base layer.

Other embodiments of the disclosure provide an integrated circuit (IC) structure including: a polycrystalline isolation layer over a substrate; a collector layer over the polycrystalline isolation layer, the collector layer including: a subcollector region on the polycrystalline isolation layer, the subcollector region having a first doping type, wherein a material composition of the subcollector region includes a polycrystalline semiconductor, and wherein a lower surface of the subcollector region physically interfaces with an upper surface of the polycrystalline isolation layer; an overlying collector region on a first portion of the subcollector region; a monocrystalline base layer on the overlying collector region, the monocrystalline base layer having a second doping type opposite the first doping type; and an emitter layer on the monocrystalline base layer, the emitter layer having the first doping type.

Additional embodiments of the disclosure provide a method of forming a bipolar transistor structure, the method including: method of forming a bipolar transistor structure, the method comprising: forming a collector layer on a polycrystalline isolation layer, the collector layer having a first doping type, such that a lower surface of the collector layer physically interfaces with an upper surface of the polycrystalline isolation layer; forming a base layer on the collector layer, the base layer having a second doping type opposite the first doping type; and forming an emitter layer on the base layer, the emitter layer having the first doping type, wherein the material composition of the collector layer is different from a material composition of the base layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
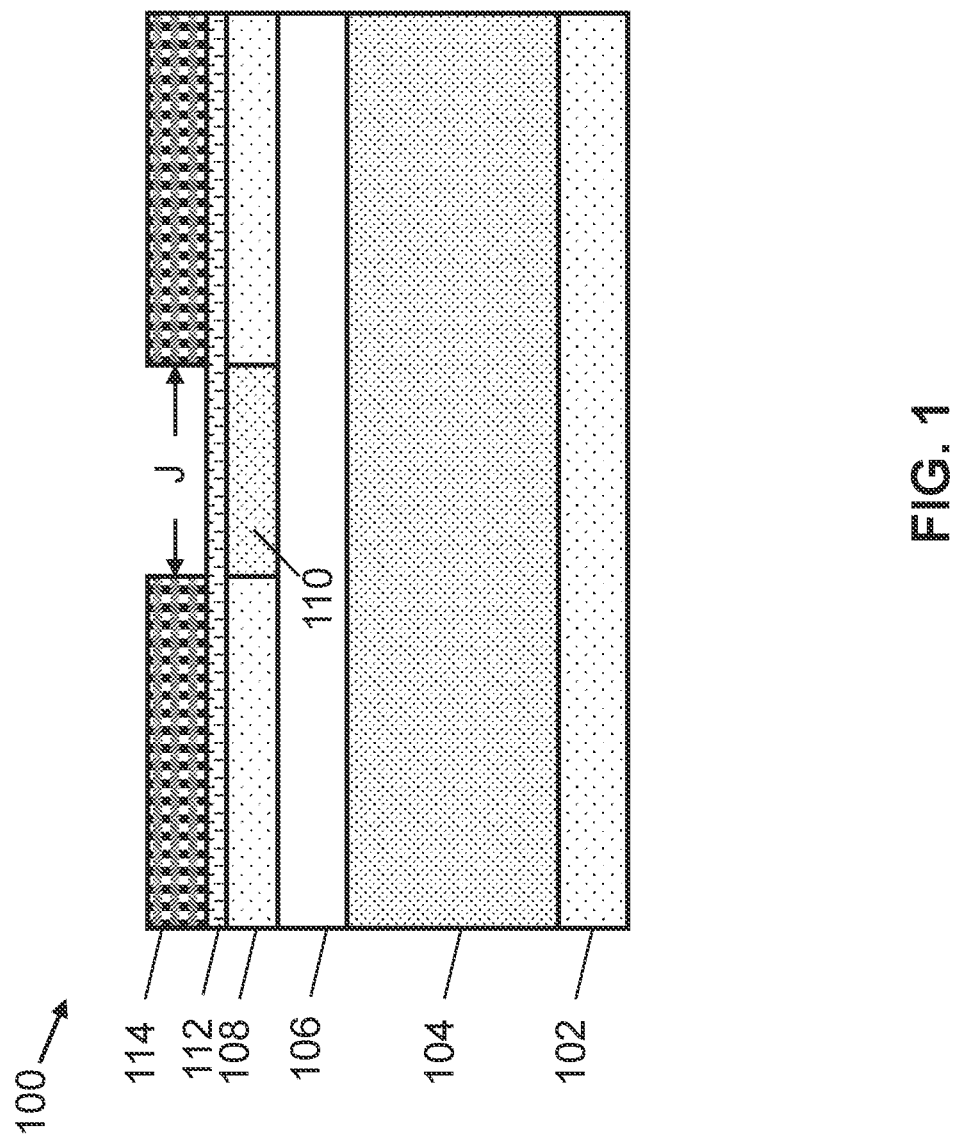
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure in which a collector layer of a first doping type is over a polycrystalline isolation layer. The collector layer may be formed, e.g., by epitaxial growth of a doped semiconductor material from the polycrystalline isolation layer and/or adjacent regions of semiconductor on insulator (SOI) material. A lower surface of the collector layer physically interfaces with an upper surface of the polycrystalline isolation layer. The terms "epitaxy" or "epitaxial growth" as used herein refer to a process by which a thin layer of single-crystal material is deposited on single-crystal substrate. Epitaxial growth occurs in such way that the crystallographic structure of the substrate is reproduced in the epitaxially grown material(s). Additionally, crystalline defects of the substrate are reproduced in the epitaxially grown material(s). Thus, at least part of the collector layer includes polycrystalline semiconductor material (e.g., with dopants to increase conductivity). A base layer of a second, opposite doping type may be on the collector layer. An emitter layer of the first doping type may be on the base layer. The collector layer may have a different material composition relative to a material composition of the base layer and emitter layer. In some cases, this difference in material composition may provide a heterojunction bipolar transistor (HBT) structure (i.e., a bipolar transistor with a P-N junction between two different materials) on the polycrystalline isolation layer. Embodiments of the disclosure may permit only partial removal and/or processing of a polycrystalline isolation layer and may allow such material to be a seed layer to form the eventual collector layer of the bipolar transistor structure.

Bipolar junction transistor (BJT) structures, such as those in embodiments of the current disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, an initial structure 100 (simply "structure" hereafter) suitable to form a vertical bipolar transistor structure, according to embodiments of the disclosure, is shown. Initial structure 100 may be processed as described herein to yield one or more vertical bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Initial structure 100 may also include a polycrystalline isolation layer 104 on substrate 102. As will be described herein, polycrystalline isolation layer 104 may be formed by introducing ions of a noble gas ions into a semiconductor layer on substrate 102 and/or an upper portion thereof and annealing the semiconductor material with the noble gas ions therein. In one example, substrate 102 may have a resistivity of between approximately ten and approximately three-thousand Ohm-centimeters ($\Omega$-cm), and polycrystalline isolation layer 104 may have a resistivity of greater than ten-thousand $\Omega$-cm. Hence, polycrystalline isolation layer 104 exhibits a high resistance compared to substrate 102, and thus acts to electrically isolate overlying active materials from substrate 102. Despite its high resistivity, polycrystalline isolation layer 104 has a semiconductor composition and thus can be used as a seed layer for deposition and epitaxial growth of other semiconductor materials of varying conductivity.

Initial structure 100 includes embedded elements for electrically separating active materials formed thereon from other regions and/or materials from substrate 102 and/or polycrystalline isolation layer 104. A buried insulator layer 106 may be formed over polycrystalline isolation layer 104, e.g., by forming one or more insulative materials on doped semiconductor well by deposition and/or by otherwise converting pre-existing semiconductor material into an insulative substance. Buried insulator layer 106 may extend horizontally over substrate 102 and polycrystalline isolation layer 104, and/or may be located under locations where active materials are formed, examples of which are discussed elsewhere herein. Buried insulator layer 106 may include oxygen doping to form a dielectric insulator or a buried oxide ("BOX") layer above substrate 102 and electrically isolate overlying active semiconductor materials. Buried insulator layer 106 may include other elements or molecules such as Ge, N, or Si. Buried insulator layer 106 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Initial structure 100 may include a semiconductor on insulator (SOI) layer 108 on buried insulator layer 106. SOI layer 108 may include, e.g., SiGe or any other semiconductor material that is doped to have a predetermined polarity. SOI layer 108 may extend to a predetermined height over buried insulator layer 106. SOI layer 108 may include the same material as substrate 102 and/or similar semiconductor materials. Selected portions of SOI layer 108 may have dopants therein and thus may define a doped portion 110 of SOI layer 108. To form doped portion 110, embodiments of the disclosure may include forming a masking layer 112 (e.g., an insulative nitride layer) on SOI layer 108, followed by a photoresist layer 114 on masking layer 112. Photoresist layer 114 may include an opening J that is structured to target a portion of SOI layer 108 for doping. Doped portion 110 can be formed by introducing dopants into SOI layer 108, e.g., by implantation and/or any other conceivable process to introduce dopant material(s) into a layer of semiconductor material. In an example implementation, SOI layer 108 may be doped N type to form doped portion 110 with N type doping.

Figure 2:
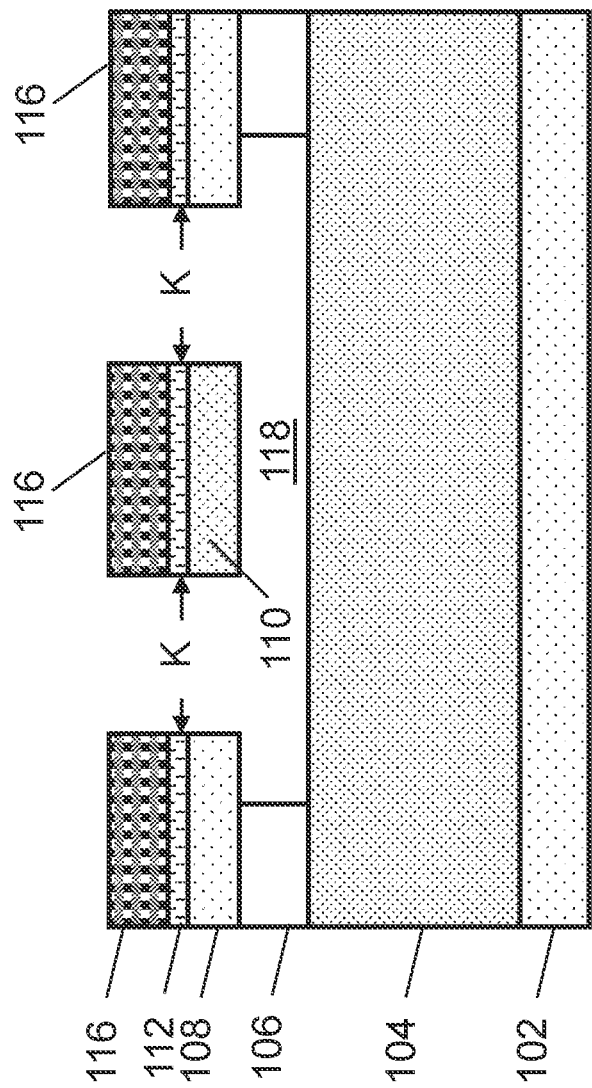
FIG. 2 provides a cross-sectional view of forming an opening over a polycrystalline insulator layer according to embodiments of the disclosure.

Proceeding to FIG. 2, embodiments of the disclosure may include removing portions of SOI layer 108 and buried insulator layer 106 thereunder to allow subsequent forming of various active semiconductor materials. Such processing, optionally, may include removing photoresist layer 114 and replacing it with an additional photoresist layer 116 on masking layer 112. In other cases, photoresist layer 114 may be removed and portions of masking layer 112 may be processed (e.g., by vertical etching) to expose portions of SOI layer 108 thereunder. In either case, masking layer 112 and/or photoresist layer 116 facilitate removing of SOI layer 108 and buried insulator layer 106 in selected locations. In either scenario, masking layer 112 or additional photoresist layer 116 may include openings K positioned adjacent doped portion 110 of SOI layer 108. As shown in FIG. 2, any appropriate etching process, e.g., reactive ion etching (RIE) of masking layer 112 and/or additional photoresist layer 116 removes SOI layer 108 and buried insulator layer 106 thereunder to expose polycrystalline isolation layer 104. In some cases, embodiments of the disclosure may include applying a predetermined amount of selective etchants (e.g., those selective to oxide material(s)) remove portions of buried insulator layer 106 without affecting polycrystalline isolation layer 104.

Figure 3:
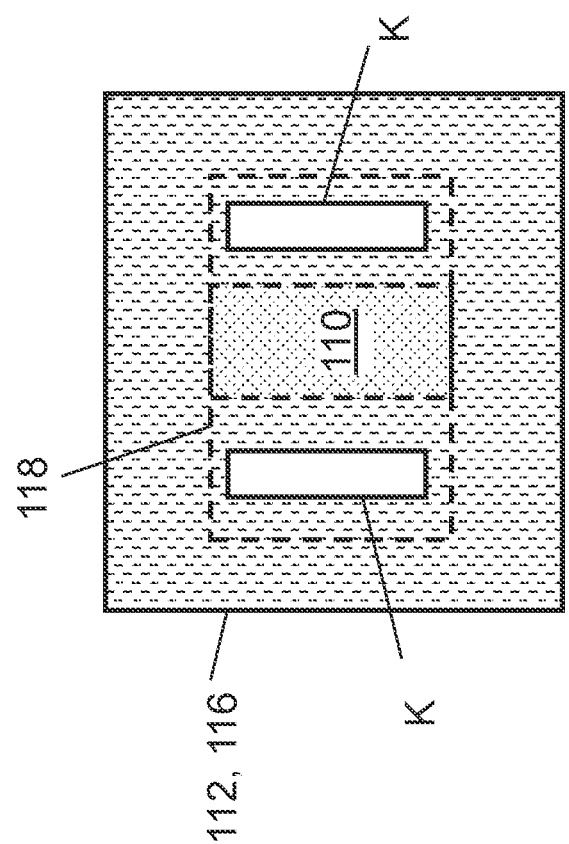
FIG. 3 provides a plan view of forming the opening over the polycrystalline insulator layer according to embodiments of the disclosure.

Turning to FIG. 3 with continued reference to FIG. 2, the removed portions of buried insulator layer 106 and SOI layer 108 may define an opening 118 over polycrystalline isolation layer 104 and adjacent any remaining portions of buried insulator layer 106. Additional photoresist layer 116 is labeled in FIG. 3 but does not include texturing for clarity of illustration. Additionally, the position and shape of openings K in masking layer 112 may cause doped portion 110 to remain intact beneath masking material 112. In this case, doped portion 110 may extend transversely across opening 118 and/or is adjacent to remaining portions of buried insulator layer 106, SOI layer 108 that are adjacent opening 118. The larger size of opening 118 beneath openings K may arise from, e.g., the use of selective etchants to remove portions of buried insulator layer 106 below SOI layer 108, as compared to the use of vertical etching to remove SOI layer 108 and/or masking material 112.

Figure 4:
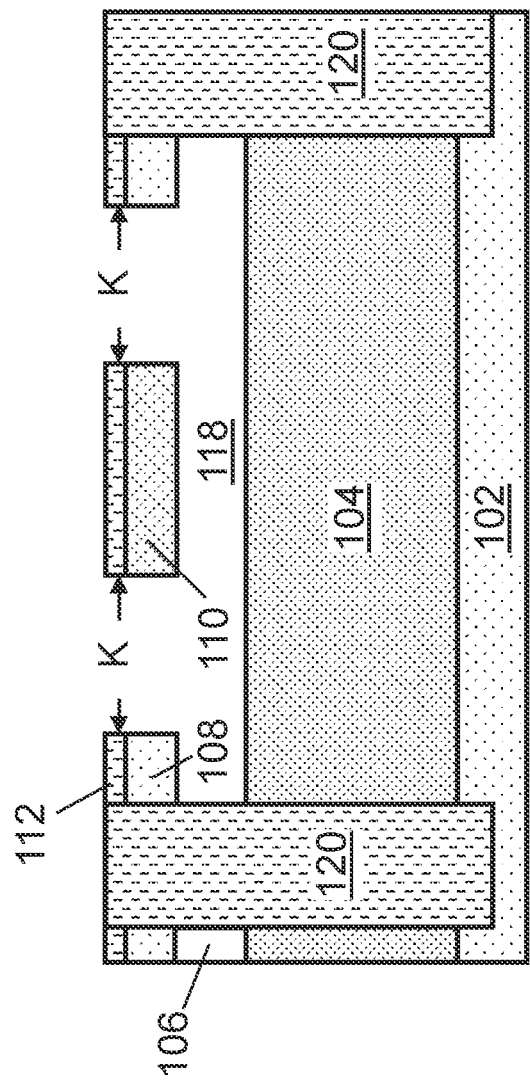
FIG. 4 provides a cross-sectional view of forming a set of deep trench (DT) isolation regions according to further embodiments of the disclosure.
Figure 9:
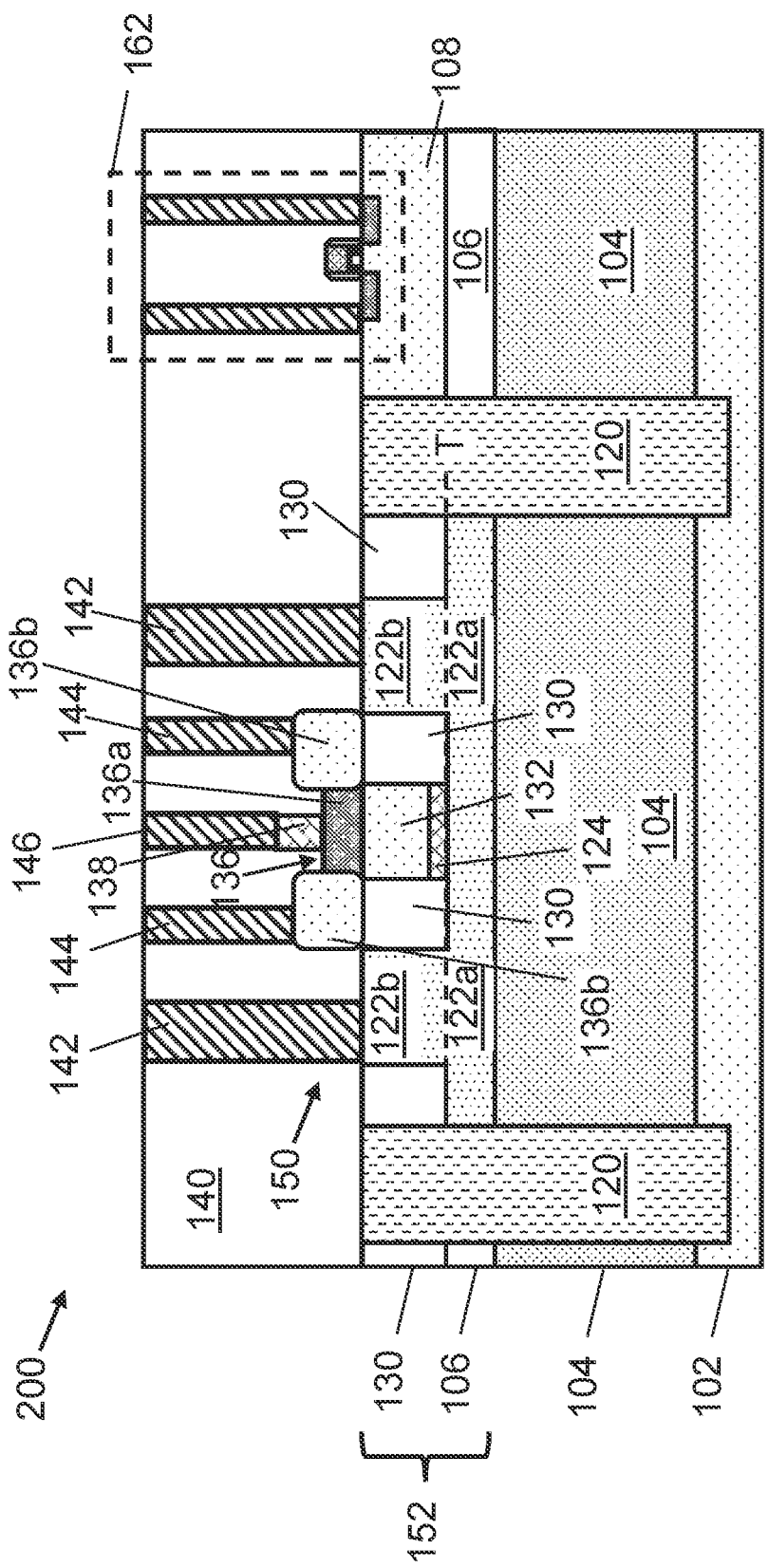
FIG. 9 provides a cross-sectional view of a bipolar transistor structure and laterally adjacent structure according to embodiments of the disclosure.

Optionally, as shown in FIG. 4, various layers and/or portions of the structure may be removed and replaced with a deep trench (DT) isolation 120 to structurally and electrically isolate opening 118 and any material(s) formed therein from other devices formed elsewhere on the same structure. To form DT isolation 120, portions of SOI layer 108, buried insulator layer 106, polycrystalline isolation layer 104, and portions of substrate 102 thereunder may be removed (e.g., by targeted vertical etching) to form an opening (not shown). The opening is then filled with an insulative material (e.g., any insulative material(s) appropriate for use in buried insulator layer 106) or a combination of insulative and polycrystalline semiconductor material(s) to electrically separate any materials that are adjacent (or enclosed by) DT isolation(s) 120 from other structures. DT isolation(s) 120 may also prevent removal (e.g., via etching) of buried insulator layer 106 in subsequent processing. DT isolation 120 may be distinguished from other types of isolation materials discussed herein, e.g., by extending through polycrystalline isolation layer 104 and partially into substrate 102. In the description and illustration of subsequent processing, DT isolation(s) 120 are omitted but may remain in the position shown in FIG. 4. The position of DT isolation(s) 120 in bipolar transistor structures according to the disclosure is also shown in FIG. 9 and discussed elsewhere herein.

Figure 5:
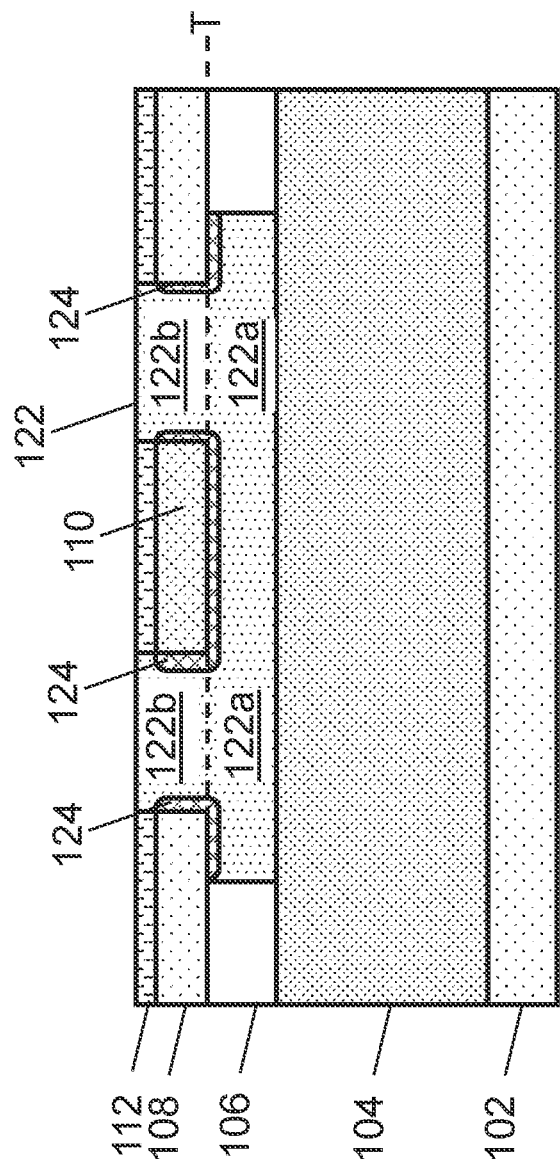
FIG. 5 provides a cross-sectional view of forming a collector layer on the polycrystalline insulator layer and within the opening according to embodiments of the disclosure.

FIG. 5 depicts continued fabrication processes in which additionally semiconductor materials are formed on polycrystalline isolation layer 104 and within opening 118 (FIGS. 2-4). Embodiments of the disclosure include forming a subcollector layer 122 within opening 118, e.g., by deposition and/or epitaxial growth of semiconductor material(s) within opening 118. Here, polycrystalline isolation layer 104 and remaining portions of SOI layer 108 can act as a seed layer for crystalline growth of semiconductor materials, and such materials can be doped to a specified polarity and concentration, e.g., Arsenic (As) or phosphorous (P) to produce N type doping, or boron (B) or gallium (Ga) for P type doping. The semiconductor material within subcollector layer 122 may have varying amounts of conductivity, e.g., by including areas of single-crystal and polycrystalline semiconductor material throughout its composition. Such variation in composition may arise from simultaneously growing semiconductor material(s) from polycrystalline isolation layer 104 and SOI layer 108 to form subcollector layer 122. A lower surface of subcollector layer 122 may physically interface with polycrystalline isolation layer 104, e.g., such that no intervening materials are between subcollector layer 122 and polycrystalline isolation layer 104 at certain locations.

Subcollector layer 122 can be doped to the same polarity and concentration (e.g., via in situ doping or other techniques), but the conductivity of subcollector layer 122 may be location-dependent. For instance, subcollector layer 122 may include a first region 122a that is on polycrystalline isolation layer 104, adjacent buried insulator layer 106. The upper surface of first region 122a moreover may be below a physical interface (indicated with dashed line T) between buried insulator layer 106 and SOI layer 108. Subcollector layer 122 also may include a second region 122b that is located on first region 122a, adjacent remaining portions of SOI layer 108, and above the vertical interface (indicated with dashed line T) between buried insulator layer 106 and SOI layer 108. Second region 122b may have higher conductivity than first region 122a, e.g., by doing a subsequently introducing dopants (e.g., by implantation) to increase conductivity of second region 122b. Despite possible variances in conductivity, there may be no visible interface between portions 122a, 122b of subcollector layer 122 and the doping concentration through subcollector layer 122 may be substantially uniform. Subcollector layer 122 thus may provide active semiconductor material that may partially define a collector terminal of an eventual bipolar transistor structure according to embodiments of the disclosure.

The forming of subcollector layer 122 (e.g., by epitaxial growth) may also include forming a group of single-crystal semiconductor regions 124 within and/or adjacent subcollector layer 122. Single-crystal semiconductor regions 124 may not include polycrystalline semiconductor material(s) therein and may be confined to spaces immediately adjacent SOI layer 108 and/or doped portion 110 where applicable. Single-crystal semiconductor regions 124 may have a higher conductivity than any portion of subcollector layer 122 (including second region 122b) and may aid coupling of subcollector layer 122 to other active material(s) as discussed herein.

Figure 6:
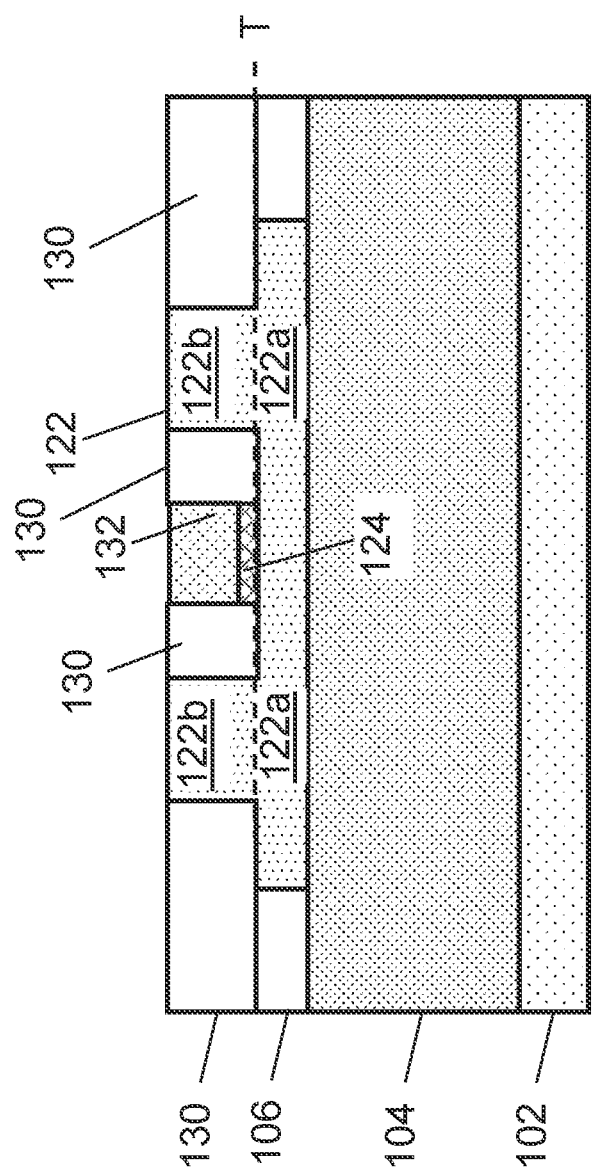
FIG. 6 provides a cross-sectional view of forming trench isolation (TI) material, a base layer, and emitter layer according to embodiments of the disclosure.

FIG. 6 depicts further processing to form additional electrically isolating and conductive materials of a bipolar transistor. Here, masking layer 112 may be removed and remaining portions of SOI layer 108 may be replaced with a set of trench isolation (TI) layers 130 on buried insulator layer 106 and some portions of subcollector layer 122. Forming of TI layer(s) 130 may electrically isolating multiple structures (e.g., conductive semiconductor materials of a bipolar transistor) and components formed thereon from each other. After being formed, TI layer(s) 130 may have a substantially uniform height above buried insulator layer 106, e.g., by planarizing the composition of TI layer(s) 130 after they are formed.

Targeted areas of doped portion 110 (FIGS. 1, 2, 4, 5) also may be removed and replaced with TI(s) 130. The remaining areas of doped portion 110 that is not replaced with TI(s) 130 may provide an overlying collector layer 132 that is over a portion of subcollector layer 122, such as the first region 122a of subcollector layer 122. In some cases, as shown by example in FIG. 6, single-crystal semiconductor region 124 may remain intact vertically between subcollector layer 122 and overlying collector layer 132. Overlying collector layer may have an upper surface that is substantially coplanar with the upper surface(s) of TI(s) 130 and/or second region(s) 122b of subcollector layer 122. In this configuration, remaining active materials for a bipolar transistor structure may be formed on subcollector layer 122 and overlying collector layer 132.

Figure 7:
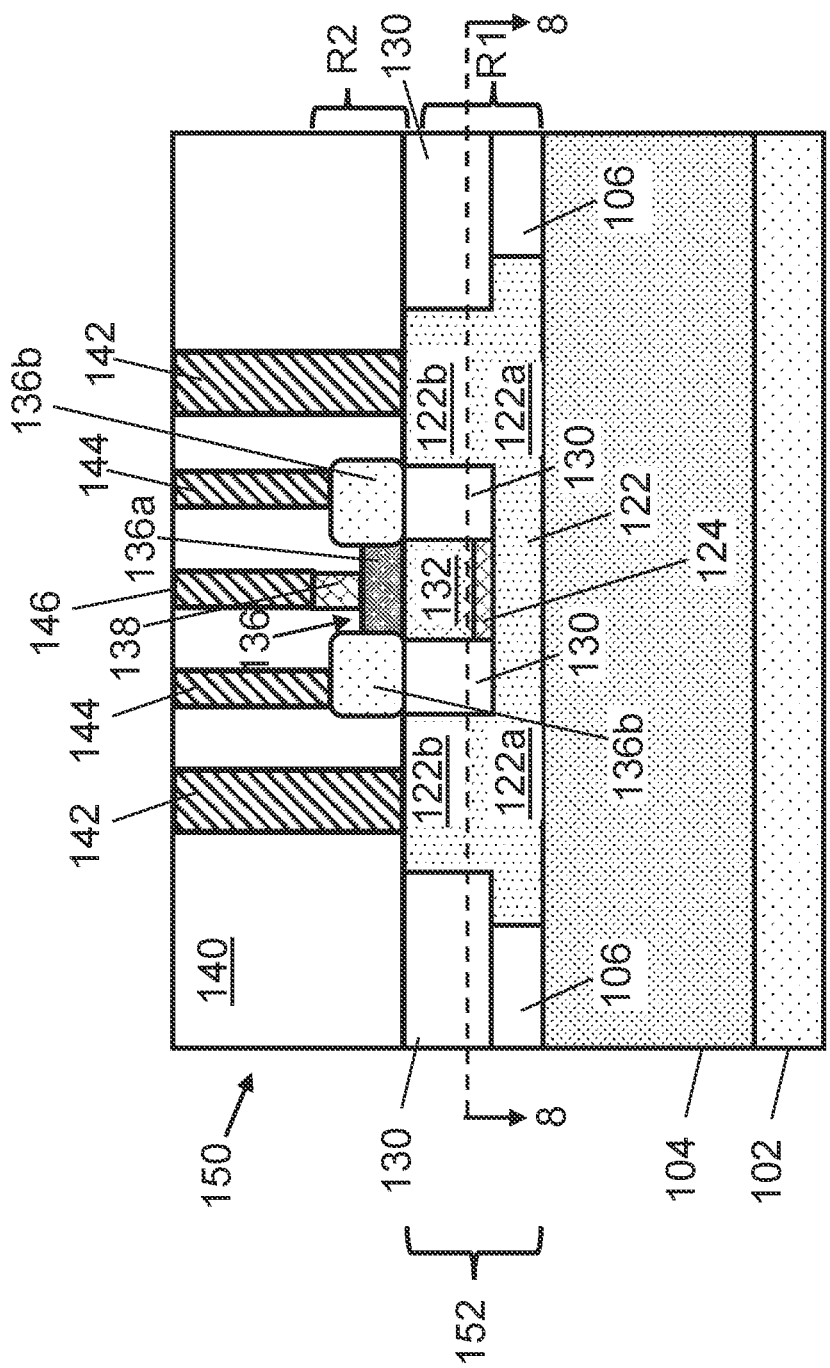
FIG. 7 provides a cross-sectional view of a bipolar transistor structure according to embodiments of the disclosure.

FIG. 7 depicts forming additional active components on subcollector layer 122, TI(s) 130, and overlying collector layer 132. Methods according to the disclosure may include forming a base layer 136 on overlying collector layer 132, also partially on adjacent TI(s) 130. Base layer 136 may be formed by deposition of silicon and/or other semiconductor materials on overlying collector layer 132 but may be of the opposite doping type from overlying collector layer 132 thereunder. Base layer 136 may be subdivided into multiple areas of varying conductivity, e.g., an intrinsic base region 136a that is on overlying collector layer 132 and a set (i.e., one or more) of extrinsic base regions 136b that are adjacent intrinsic base region 136a. Extrinsic base regions 136b may differ from intrinsic base region 136a by having a higher concentration of dopants, but all regions 136a, 136b of base layer 136 may have the opposite doping type from overlying collector layer 132. The higher doping concentration in extrinsic base region 136b may increase electrical conductivity between base layer 136 and any overlying contacts for controlling the flow of current through the lateral bipolar transistor structure. The physical interface between overlying collector layer 132 and base layer 136 may define a P-N heterojunction for enable selective current flow from overlying collector layer 132 to other active semiconductor materials through base layer 136.

FIG. 7 also depicts forming an emitter layer 138 on base layer 136. In this phase of processing, emitter layer 138 may be formed by deposition and/or epitaxial growth of silicon and/or other semiconductor materials on base layer 136 but may be of the same doping type as subcollector layer 122 and overlying collector layer 132. Emitter layer 138 can be formed for example by selectively growing silicon material above base layer 136 and then doping emitter layer 138 to have a different doping type from base layer 136 thereunder. Emitter layer 138 can also be formed by depositing a blanket layer of emitter material (e.g., polycrystalline silicon) on all exposed surfaces, which then may be etched back to form emitter layer 138. In this case, emitter 138 may include polycrystalline semiconductor material but base layer 136 will not include polycrystalline semiconductor material. Despite differences in doping polarity, base layer 136 and emitter layer 138 may be formed of the same type of semiconductor material (e.g., monocrystalline semiconductor material(s) such as silicon or silicon germanium). In some cases, neither base layer 136 nor emitter layer 138 thus may not include any polycrystalline semiconductor material therein. Due to the presence of polycrystalline material in subcollector layer 122, layers 136, 138 may have a different composition from subcollector layer 122 and overlying collector layer 132.

Further processing may include forming an inter-level dielectric (ILD) layer 140 over subcollector layer 122, TI(s) 130, layers 132, 136, 138, e.g., by deposition or other techniques of forming an insulative material on a structure. ILD layer 140 may include the same insulating material as TI(s) 130 or may include a different electrically insulative material. ILD layer 140 and TI(s) 130 nonetheless constitute different components, e.g., due to TI(s) 130 being formed within and alongside portions of subcollector layer 122 instead of being formed thereon. ILD layer 140 at this stage may indicate only a portion of the eventual ILD layer 140 material to be formed. After depositing ILD layer 140, ILD layer 140 can be planarized (e.g., using chemical mechanical planarization (CMP)) such that it has a desired vertical thickness.

FIG. 7 also depicts the coupling of layers 122, 136, 138 to other structures. In some implementations (not shown), a silicide layer as known in the art could be formed on the upper surface of one or more layers 122, 136, 138 prior to ILD layer 140 deposition. For example, a Co, Ti, NI, Pt, or similar self-aligned silicide (silicide) could be formed prior to ILD layer 140 deposition. Additional metallization layers (not shown) may be formed on ILD layer 140 during middle-of-line and/or back-end-of-line processing. To electrically couple various components discussed herein to such metallization layers, one or more collector contacts 142 may be formed on subcollector layer 122, one or more base contacts 144 may be formed on base layer 136 (e.g., at extrinsic base regions 136b thereof), and one or more emitter contacts 146 may be formed on emitter layer 138 and within ILD layer 140. To form contacts 142, 144, 146, portions of ILD layer 140 may be removed by vertical etching (e.g., by RIE). Contacts 142, 144, 146 may be formed by forming conductive material(s) within the removed portions of ILD 140. Each contact 142, 144, 146 may include any currently known or later developed conductive material configured for use in an electrical contact, e.g., tungsten (W), copper (Cu), aluminum (Al), gold (Au), etc. Contacts 142, 144, 146 may additionally include refractory metal liners (not shown) positioned alongside ILD layer 140 to prevent electromigration degradation, shorting to other components, etc. As discussed herein, selected portions of layers 122, 136, 138 may include silicide regions (i.e., portions of semiconductor that are annealed in the presence of an overlying conductor) to increase the electrical conductivity at their physical interface with contact(s) 142, 144, 146, where applicable.

Figure 8:
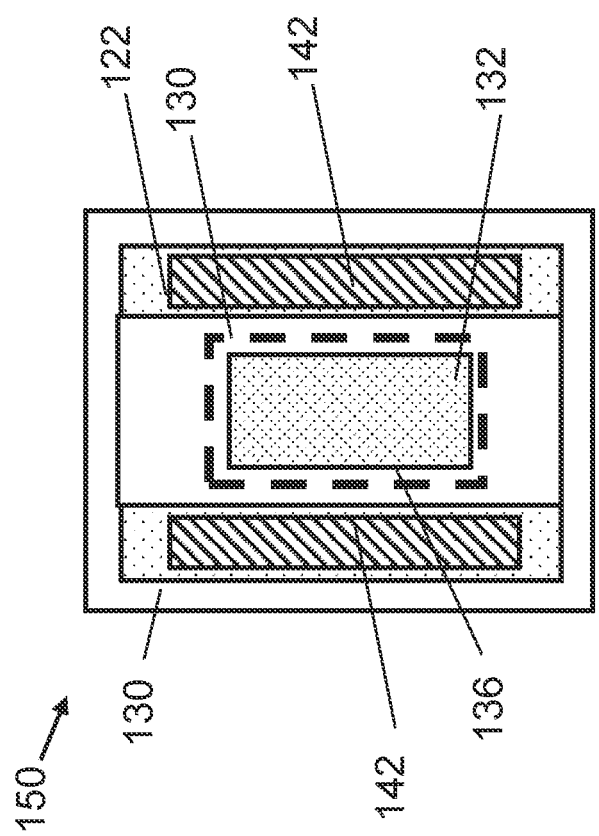
FIG. 8 provides a plan view of a bipolar transistor structure along view line 8-8 of FIG. 7 according to embodiments of the disclosure.

Referring to FIGS. 7 and 8 together, in which FIG. 8 depicts a plan view along view line 8-8 of FIG. 7, embodiments of the disclosure provide a bipolar transistor structure 150 with polycrystalline isolation layer 104, subcollector layer 122m and overlying collector layer 132 included therein. Bipolar transistor structure 150 may include (e.g., because of processes discussed herein) polycrystalline isolation layer 104 over substrate 102. Subcollector layer 122 and overlying collector layer 132 maybe above polycrystalline isolation layer 104 and may be formed such that layer(s) 122, 132 include polycrystalline semiconductor material(s) therein. Subcollector layer 122, in addition, may include first region 122a that is adjacent buried insulator layer 106 and second region 122b that is on first region 122a and adjacent TI(s) 130.

In some cases, subcollector layer 122, single-crystal semiconductor region(s) 124, and overlying collector layer 132 may collectively be referred to as a "collector layer" 152 of bipolar transistor structure 150. Layer(s) 122, 132 may be doped to have a first doping type. Base layer 136 may be on overlying collector layer 132 and may have an opposite doping type relative to subcollector layer 122 and overlying collector layer 132. Emitter layer 138 may be on base layer 136 and may have the same doping type as subcollector layer 122 and overlying collector layer 132 but may have a different material composition. In this configuration, collector layer 152 including subcollector layer 122 and overlying collector layer 132 may have a vertical thickness R1 that is greater than a combined vertical thickness R2 of base layer 136 and emitter layer 138.

As depicted specifically in the FIG. 8 plan view, TI(s) 130 may horizontally surround overlying collector layer 132 and subcollector layer 122 in a vertical cross-section of bipolar transistor structure 150. Thus, TI(s) 130 may be located on first region 122a (FIG. 7) of subcollector layer 122 while being horizontally between second region 122b of subcollector layer 122 and overlying collector layer 132. The overlying positions of base layer 136 (dashed outline in FIG. 8) and collector contacts 142 (shown with cross-hatching and dashed lines in FIG. 8) may allow subcollector layer 122 and overlying collector layer 132 to be coupled to other portions of bipolar transistor structure 150.

Referring now to FIG. 9, embodiments of bipolar transistor structure 150 in some cases may include DT isolation(s) 120 adjacent polycrystalline isolation layer 104, subcollector layer 122, and TI(s) 130. As discussed elsewhere herein, DT isolation(s) 120 may extend vertically from within a portion of substrate 102 to a lower surface of ILD layer 140 but may have different vertical thicknesses in various alternative implementations. DT isolation(s) 120 may be horizontally between subcollector layer 122 and other portions of polycrystalline isolation layer 104 and/or buried insulator layer 106 thereover. Moreover, DT isolation(s) 120 may horizontally separate an active device 162 (depicted as a field effect transistor FET as an example, but alternatively including another bipolar transistor, a resistor, a capacitor, etc.) from bipolar transistor structure 150. In this case, an IC structure 200 according to embodiments together may include bipolar transistor structure 150 over the same substrate 102 as active device(s) 162. Active device(s) 162 may contrast with bipolar transistor structure 150, e.g., by being on a remaining portion of SOI layer 108 that is located over other portions of buried insulator layer 106 and polycrystalline isolation layer 104 but separated from bipolar transistor structure 150 by DT isolation(s) 120.

The present disclosure provides various technical and commercial advantages, examples of which are discussed herein. In radio frequency (RF) applications, embodiments of bipolar transistor structure 150 may be implemented at lower cost and may be less prone to manufacturing errors, e.g., due to the position and size of subcollector layer 122 relative to other layers, as described in non-limiting examples of the disclosure. Polycrystalline isolation layer 104 in addition may provide sufficient electrical isolation from underlying portions of substrate 102 and may be easier to be integrated into a device structure than non-polycrystalline insulative materials used in other bipolar transistor configurations. Embodiments of the disclosure may also be structurally integrated with complementary metal oxide semiconductor (CMOS) structures (indicated, e.g., by active device 162 in FIG. 9) without substantial changes to the use of substrate 102, polycrystalline isolation layer 104, buried insulator layer 106, and/or SOI layer 108.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
a polycrystalline isolation layer on a substrate;
a collector layer over the polycrystalline isolation layer, the collector layer having a first doping type, wherein a lower surface of the collector layer physically interfaces with an upper surface of the polycrystalline isolation layer;
a base layer on the collector layer, the base layer having a second doping type opposite the first doping type; and
an emitter layer on the base layer, the emitter layer having the first doping type,
wherein the material composition of the collector layer is different from a material composition of the base layer.

2. The bipolar transistor structure of claim 1, wherein the collector layer includes a subcollector layer on the polycrystalline isolation layer and an overlying collector layer on the subcollector layer.

3. The bipolar transistor structure of claim 2, further comprising a trench isolation (TI) on the subcollector layer and horizontally adjacent the overlying collector layer.

4. The bipolar transistor structure of claim 1, further comprising a buried insulator layer adjacent the collector layer.

5. The bipolar transistor structure of claim 4, further comprising a semiconductor on insulator (SOI) layer on the buried insulator layer, wherein a vertical thickness of the collector layer is greater than a vertical thickness of the SOI layer, and wherein a lower surface of the collector layer is below a lower surface of the SOI layer.

6. The bipolar transistor structure of claim 4, further comprising a deep trench (DT) isolation region horizontally adjacent the polycrystalline isolation layer and the buried insulator layer.

7. The bipolar transistor structure of claim 1, wherein the emitter layer includes a monocrystalline semiconductor material or a polycrystalline semiconductor material.

8. An integrated circuit (IC) structure comprising:
a polycrystalline isolation layer over a substrate;
a collector layer over the polycrystalline isolation layer, the collector layer including:
a subcollector region on the polycrystalline isolation layer, the subcollector region having a first doping type, wherein a material composition of the subcollector region includes a polycrystalline semiconductor, and wherein a lower surface of the subcollector region physically interfaces with an upper surface of the polycrystalline isolation layer;
an overlying collector region on a first portion of the subcollector region;
a monocrystalline base layer on the overlying collector region, the monocrystalline base layer having a second doping type opposite the first doping type; and
an emitter layer on the monocrystalline base layer, the emitter layer having the first doping type.

9. The IC structure of claim 8, further comprising a trench isolation (TI) on a second portion of the subcollector region and adjacent the overlying collector region.

10. The IC structure of claim 9, wherein the TI horizontally surrounds the overlying collector region.

11. The IC structure of claim 8, further comprising a buried insulator layer adjacent the subcollector region.

12. The IC structure of claim 11, further comprising a deep trench (DT) isolation region horizontally adjacent the polycrystalline isolation layer and the buried insulator layer.

13. The IC structure of claim 11, further comprising a semiconductor on insulator (SOI) layer on the buried insulator layer, wherein a vertical thickness of the collector layer is greater than a vertical thickness of the SOI layer, and wherein a lower surface of the collector layer is below a lower surface of the SOI layer.

14. The IC structure of claim 8, wherein the emitter layer includes a monocrystalline semiconductor material or a polycrystalline semiconductor material.

15. A method of forming a bipolar transistor structure, the method comprising:
forming a collector layer on a polycrystalline isolation layer, the collector layer having a first doping type, such that a lower surface of the collector layer physically interfaces with an upper surface of the polycrystalline isolation layer;
forming a base layer on the collector layer, the base layer having a second doping type opposite the first doping type; and
forming an emitter layer on the base layer, the emitter layer having the first doping type, wherein the material composition of the collector layer is different from a material composition of the base layer.

16. The method of claim 15, wherein forming the collector layer includes forming a subcollector layer on the polycrystalline isolation layer and forming an overlying collector layer on the subcollector layer.

17. The method of claim 16, further comprising a deep trench (DT) isolation region horizontally adjacent the polycrystalline isolation layer and a buried insulator layer on the subcollector layer and adjacent the overlying collector layer.

18. The method of claim 16, further comprising forming a trench isolation (TI) on the subcollector layer and horizontally adjacent the overlying collector layer, wherein the TI horizontally surrounds the overlying collector layer.

19. The method of claim 15, further comprising:
  forming a buried insulator layer on or adjacent a first portion of the polycrystalline isolation layer; and
  forming a semiconductor on insulator (SOI) layer on the buried insulator layer,
  wherein forming the collector layer includes epitaxially growing the polycrystalline semiconductor from the SOI layer and the polycrystalline isolation layer.

20. The method of claim 15, wherein emitter layer includes a monocrystalline semiconductor material or a polycrystalline semiconductor material.

* * * * *